United States Patent [19]

Lur et al.

[11] Patent Number: 5,254,495
[45] Date of Patent: Oct. 19, 1993

[54] SALICIDE RECESSED LOCAL OXIDATION OF SILICON

[75] Inventors: Water Lur, Taipei; J. Y. Wu, Dou-Lio, both of Taiwan

[73] Assignee: United Microelectronics Corporation, Hsinchu, Taiwan

[21] Appl. No.: 57,882

[22] Filed: May 7, 1993

[51] Int. Cl.⁵ .......................................... H01L 71/302
[52] U.S. Cl. ....................................... 437/70; 437/69; 437/72; 437/200
[58] Field of Search ...................... 437/70, 72, 200, 69, 437/67, 968; 148/DIG. 50, DIG. 51, DIG. 147; 156/656, 657

[56] References Cited

U.S. PATENT DOCUMENTS

| | | | |
|---|---|---|---|
| 4,430,793 | 2/1984 | Hart | 437/70 |
| 4,637,128 | 1/1987 | Mizutani | 437/70 |
| 4,743,566 | 5/1988 | Bastiaens et al. | 437/70 |
| 4,912,062 | 3/1990 | Verma | 437/70 |
| 4,965,221 | 10/1990 | Dennison et al. | 437/70 |
| 5,124,272 | 6/1992 | Saito et al. | 437/192 |
| 5,137,843 | 8/1992 | Kim et al. | 437/70 |
| 5,139,964 | 8/1992 | Onishi et al. | 437/70 |

Primary Examiner—Brian E. Hearn
Assistant Examiner—Kevin M. Picardat
Attorney, Agent, or Firm—George O. Saile

[57] ABSTRACT

A new method of local oxidation using a salicide recessed oxidation process is described. A thin silicon oxide layer is formed over the surface of a silicon substrate. A layer of silicon nitride is deposited overlying the silicon oxide layer. The silicon oxide and silicon nitride layers are patterned to provide openings exposing portions of the silicon substrate that will be oxidized subsequently. A metal layer is deposited overlying the silicon nitride layer and within the openings to the substrate. Channel-stops are ion implanted into the substrate through the openings. The salicide is formed by reacting the metal layer with the silicon substrate where the metal layer contacts the substrate within the openings. The metal silicide regions are removed, leaving recesses in the silicon surface within the openings. Field oxide regions are grown within the openings. Finally, the silicon nitride and silicon oxide layers are removed thereby completing local oxidation of the integrated circuit.

25 Claims, 3 Drawing Sheets

SALICIDE RECESSED LOCAL OXIDATION OF SILICON

BACKGROUND OF THE INVENTION (1) Field of the Invention

This invention relates to the fabrication of integrated circuit devices and more particularly to a method of local oxidation using a salicide process in the fabrication of integrated circuits.

(2) Description of the Prior Art

Local oxidation of silicon is the conventional lateral isolation scheme. The conventional local oxidation process is described in *VLSI Technology*, International Edition, by S. M. Sze, McGraw-Hill Book Company, NY, N.Y., c. 1988 by McGraw-Hill Book Co., pp. 473-474. A layer of silicon nitride is deposited over a pad oxide (a thin thermal oxide which allows better adhesion between the nitride and silicon) overlying a silicon substrate. The nitride and oxide layers are etched to leave openings exposing portions of the silicon substrate where the local oxidation will take place. A boron channel-stop layer is ion implanted into the isolation regions. The field oxide is grown within the openings and the nitride and oxide layers are removed. This completes the local oxidation.

On pp. 476-477 of the aforementioned textbook, Sze describes some of the disadvantages of the growth of field oxide using the local oxidation method. He says that field oxidation can cause lateral diffusion of the channel-stop layer which raises the surface concentration of the substrate near the edges of the field oxide. This causes an increase in the threshold voltage of those portions of the active devices. The edges will not conduct as much as will the interior; therefore, the transistor will behave as if it were narrower than it is.

Another problem with the local oxidation process is that the field oxide will penetrate under the masking nitride layer causing the space between transistors to grow during oxidation. This oxide growth under nitride is called "bird's beak encroachment."

Other problems include stress in the oxide in the region covered by the nitride mask and a non-flat surface after oxidation.

These problems are addressed in the present invention by incorporating a salicide recessing process into the local oxidation process. The salicide method is well-known. It is used to build up an insulating layer between source and drain regions and gate electrodes to avoid short circuits. A metal is deposited over the integrated circuit and heat-treated to cause the metal to react with the polysilicon of the gate and the monosilicon of the source/drain regions. The metal does not react with underlying silicon oxide or silicon nitride layers. The metal that has not reacted is etched away leaving the silicide insulating areas. U.S. Pat. Nos. 4,855,247 to Ma et al and 4,912,061 to Nasr are examples of patents describing salicide processes. The present invention applies a salicide method in a novel approach to local oxidation.

SUMMARY OF THE INVENTION

A principal object of the invention is to provide an effective and very manufacturable method to locally oxidize the silicon in an integrated circuit.

Another object of the present invention is to provide a method of local oxidation of silicon that will provide a minimum width diffusion.

Yet another object is to provide a method of local oxidation which provides a flat surface for subsequent processes.

Yet another object of the invention is to provide a method of locally oxidizing the silicon in an integrated circuit whereby a minimum of stress is generated.

In accordance with the objects of this invention, a new method of local oxidation using a salicide recessed oxidation process is achieved. A thin silicon oxide layer is formed over the surface of a silicon substrate. A layer of silicon nitride is deposited overlying the silicon oxide layer. The silicon oxide and silicon nitride layers are patterned to provide openings exposing portions of the silicon substrate that will be oxidized subsequently. A metal layer is deposited overlying the silicon nitride layer and within the openings to the substrate. Channel-stops are ion implanted into the substrate through the openings. The salicide is formed by reacting the metal layer with the silicon substrate where the metal layer contacts the substrate within the openings. The metal silicide regions are removed, leaving recesses in the silicon surface within the openings. Field oxide regions are grown within the openings. Finally, the silicon nitride and silicon oxide layers are removed thereby completing local oxidation of the integrated circuit.

BRIEF DESCRIPTION OF THE DRAWINGS

In the accompanying drawings forming a material part of this description, there is shown.

DESCRIPTION OF THE PREFERRED EMBODIMENTS

Figure 1:
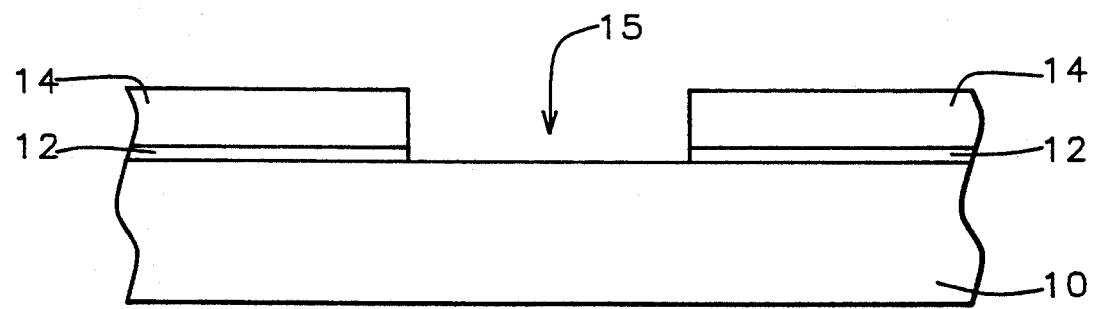
FIGS. 1 through 5 schematically illustrate in cross-sectional representation one preferred embodiment of this invention.

Referring now more particularly to FIG. 1, there is shown a monocrystalline silicon substrate 10. A layer 12 of silicon dioxide is deposited over the substrate by thermal oxidation or chemical vapor deposition to a preferred thickness of between about 100 to 1000 Angstroms. A layer of silicon nitride ($Si_3N_4$) 14 is deposited over the silicon oxide layer by chemical vapor deposition to a thickness of between about 500 to 3000 Angstroms.

The silicon nitride and silicon oxide layers are patterned using conventional lithography and etching techniques, such as plasma dry etching to provide openings 15 to the silicon substrate 10 in the places where the isolation regions are to be formed.

Figure 2:
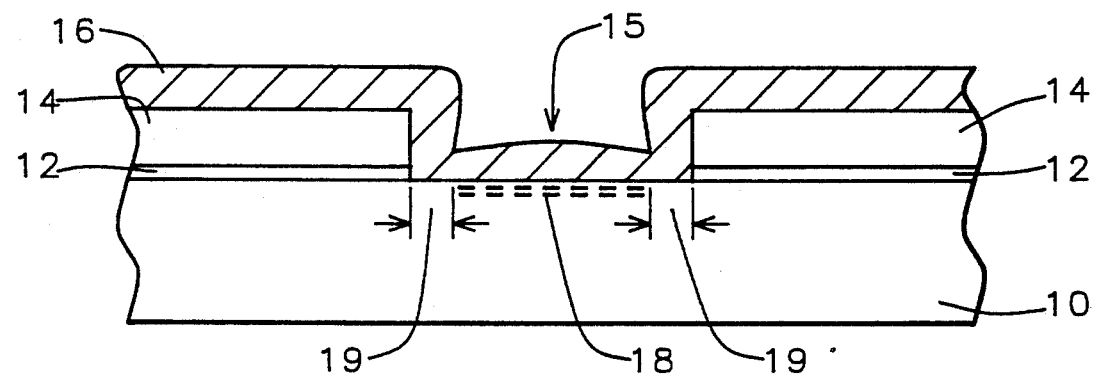

Referring now to FIG. 2, a metal layer 16 is deposited over the silicon nitride layer 14 and within the openings 15. The metal layer may be composed of titanium, cobalt, platinum, or palladium or the like. It is deposited to a thickness of between about 500 to 2000 Angstroms. Channel-stop layer 18 is ion implanting using $B+$ or $BF_2+$ ions to a dose of 1 E 13 to 5 E 14 atoms/$cm^2$ at an energy of between about 15 to 180 Kev. The sidewall width 19 acts to minimize the width diffusion of the channel stop layer 18.

Figure 3:
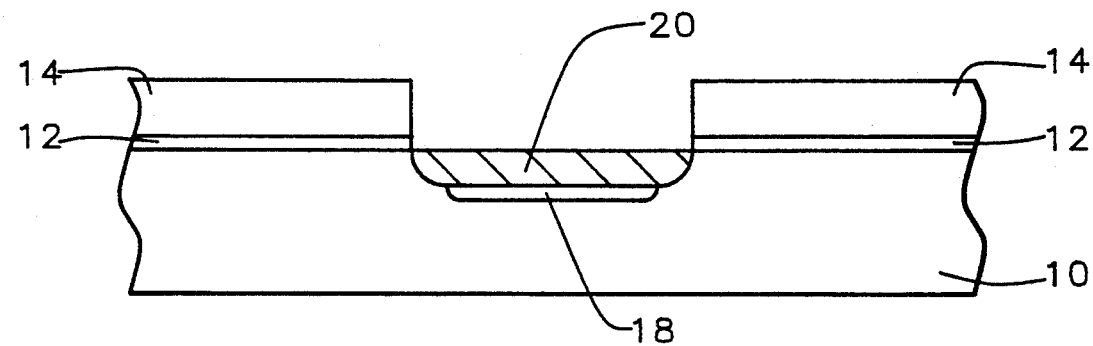

A salicide is formed by reacting the metal layer 16 with the silicon substrate 10 where they contact within openings 15. The reaction is triggered by heating the integrated circuit in a rapid thermal process furnace to a temperature of between about 600°-700° C. for about 10 to 30 seconds. The unreacted metal 16 is stripped by, for example, hot aqua regia for platinum or aqueous alkali for titanium, etc. Next, the integrated circuit is heated to a temperature of between about 750°-900° C. for a additional 10 to 30 seconds. This produces the most stable phase of the silicide region 20, shown in FIG. 3. Any of the metals titanium, cobalt, platinum, palladium, and the like may be used for the silicide formation. The heating temperature and time as well as the stripping solution for the unreacted metal differ for each of the metals to be used. Alternatively, a single heating step can be used with a temperature of 600° to 700° C. for about 10 to 60 seconds, a stripping of unreacted metal, and then a removal of reacted metal silicide. The channel stop implant 18 is partially incorporated into the silicide layer 20 and partially driven further into the substrate 10 as seen in FIG. 3.

Figure 4:
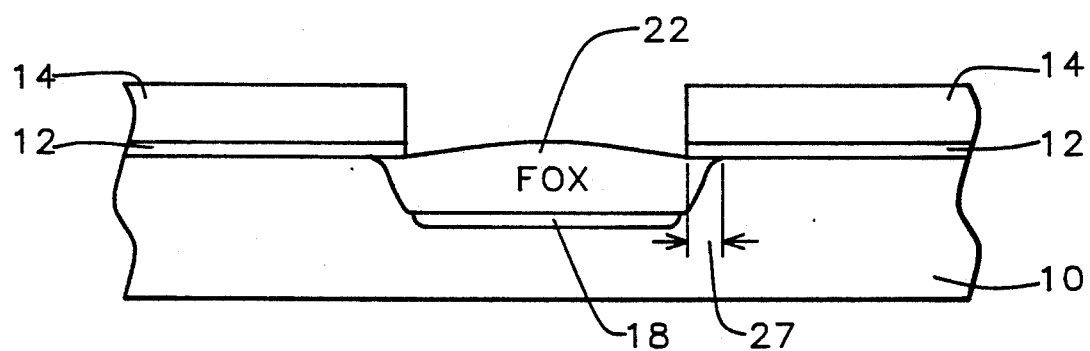

The metal silicide layer 20 is now removed by dipping the wafer in a hydrofluoric or $HNO_3$ containing solution leaving a recess in the silicon substrate. The field oxide region 22 in FIG. 4 is grown. The oxide growth serves to drive in and activate the channel-stop implant 18. Finally, the silicon nitride and silicon oxide layers 14 and 12 are removed by phosphoric acid and hydrofluoric acid, respectively completing the local oxidation as shown in FIG. 5.

Figure 5:
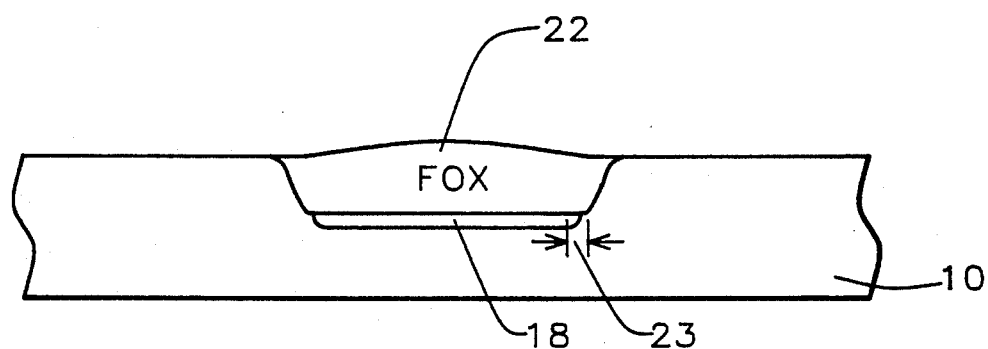
Figure 6:
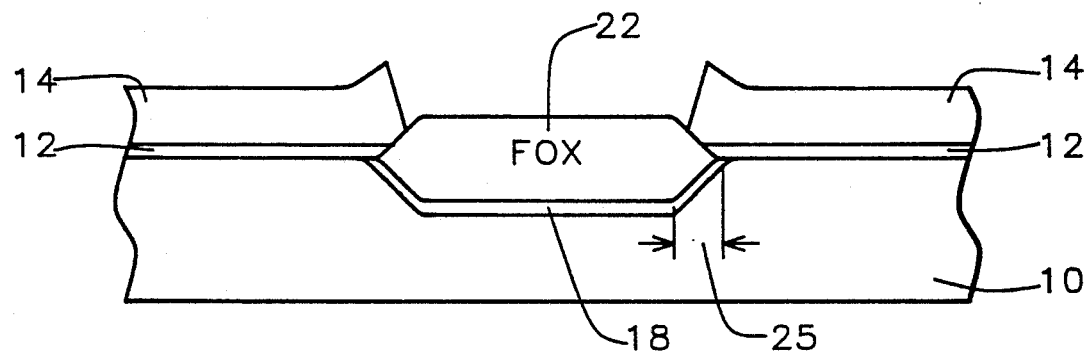
FIGS. 6 and 7 schematically illustrate in cross-sectional representation a prior art embodiment of the local oxidation process.
Figure 7:
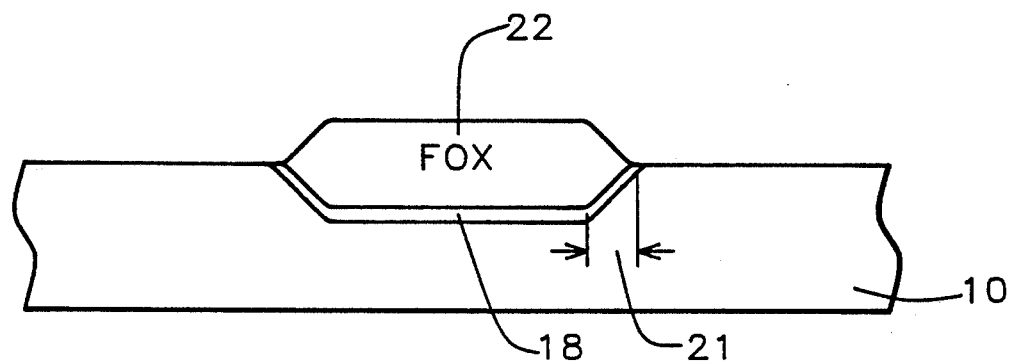

Comparing the results of the salicide recessed local oxidation process of the present invention illustrated in FIG. 5 to the results of a conventional local oxidation process illustrated in FIG. 7, the advantages of the present invention are clear. Note that the channel-stop lateral diffusion 21 is significant in FIG. 7 where the lateral diffusion 23 in FIG. 5 of the present invention is much smaller. The lateral diffusion is minimized by the existence of the sidewall metal. The surface of the integrated circuit after oxidation is much smoother in FIG. 5 than in FIG. 7 because of the recessed silicon surface after salicide stripping. The bird's beak encroachment in the prior art process, shown as width 25 in FIG. 6, is similar to that shown as width 27 in FIG. 4 of the present invention. FIG. 6 also illustrates the stress in the oxide caused by the bending of the nitride layer 14. Because of the recessed process of the present invention, the bending of the nitride layer is much less in the salicide recessed local oxidation process as seen in FIG. 4. The process of the present invention provides a local oxidation with a minimum lateral width diffusion and bird's beak encroachment, a minimum of stress generated, and a flat surface for subsequent processes.

Figure 8:
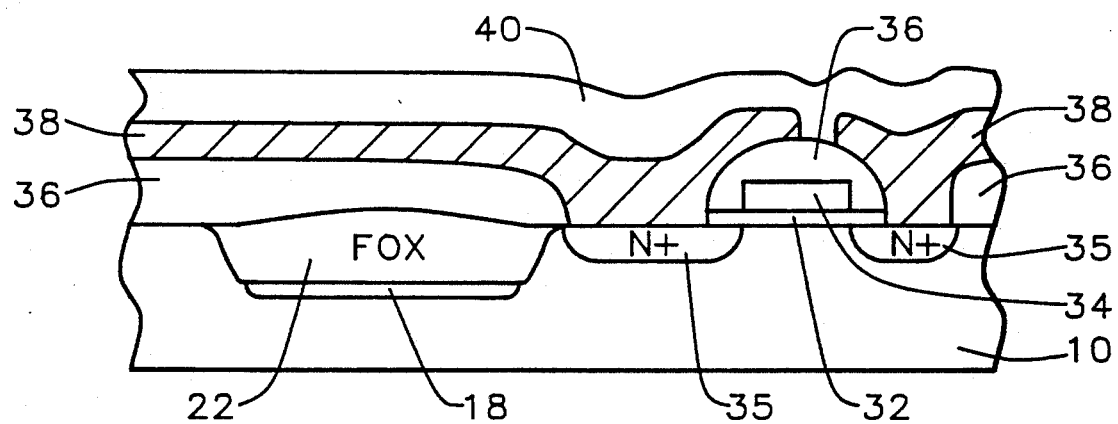
FIG. 8 schematically illustrates in cross-sectional representation a completed integrated circuit of the present invention.

The integrated circuit may be completed as is conventional in the art. For example, referring to FIG. 8, gate oxide layer 32 may be deposited followed by patterning to provide openings for buried contact regions. A threshold-adjust ion implant may be required at this point. Next, gate electrode 34 and source/drain regions 35 are fabricated. Dielectric layer 38, which may be a phosphorus-doped chemical vapor deposited oxide is deposited. Contact openings are etched through the dielectric layer to expose the source/drain regions where contacts are desired. Metal layer 38, typically aluminum, is deposited and patterned to complete contacts to the source/drain regions followed by the deposition of a top capping layer 40 of silicon nitride and/or an oxide to complete formation of the integrated circuit.

While the invention has been particularly shown and described with reference to the preferred embodiments thereof, it will be understood by those skilled in the art that various changes in form and details may be made without departing from the spirit and scope of the invention.

What is claimed is:

1. The method of local oxidation of an integrated circuit comprising:

forming a thin silicon oxide layer over the surface of a silicon substrate;

depositing a layer of silicon nitride overlying said silicon oxide layer;

patterning said silicon oxide and silicon nitride layers to provide openings exposing portions of said silicon substrate that will be oxidized subsequently using the said local oxidation method;

depositing a metal layer overlying said silicon nitride layer and within said openings to said substrate;

selectively ion implanting channel-stops into said substrate through said openings;

reacting said metal layer with said silicon substrate where said metal layer contacts said substrate within said openings to form metal silicide regions;

removing said metal silicide regions leaving recesses in said silicon surface within said openings;

growing field oxide regions within said openings; and removing said silicon nitride and said silicon oxide layers thereby completing local oxidation of said integrated circuit.

2. The method of claim 1 wherein said metal layer has a preferred thickness of between about 500 to 2000 Angstroms.

3. The method of claim 1 wherein said channel-stop implantation uses B+ ions with a dosage of between about 1 E 13 to 5 E 14 atoms/cm$^2$ and energy of between about 15 to 180 Kev.

4. The method of claim 1 wherein said channel-stop implantation uses $BF_2+$ ions with a dosage of between about 1 E 13 to 5 E 14 atoms/cm$^2$ and energy of between about 15 to 180 Kev.

5. The method of claim 1 wherein said reacting said metal layer with said silicon substrate is accomplished by a first heating of said integrated circuit to a temperature of between about 600° to 700° C. for about 10 to 30 seconds, stripping unreacted metal, and then a second heating of said integrated circuit to a temperature of between about 750° to 900° C. for an additional 10 to 30 seconds.

6. The method of claim 5 wherein said metal layer is composed of titanium and said unreacted metal is stripped in aqueous alkali.

7. The method of claim 5 wherein said metal layer is composed of platinum and said unreacted metal is stripped in hot aqua regia.

8. The method of claim 5 wherein said metal layer is composed of cobalt and said unreacted metal is stripped in sulfuric acid.

9. The method of claim 5 wherein said metal layer is composed of palladium and said unreacted metal is stripped in sulfuric acid.

10. The method of claim 1 wherein said growing of said field oxide regions also drives in said channel-stop regions.

11. The method of claim 1 wherein said silicon nitride and said silicon oxide layers are removed by phosphoric acid and hydrofluoric acid, respectively.

12. The method of local oxidation of an integrated circuit comprising:

forming a thin silicon oxide layer over the surface of a silicon substrate;

depositing a layer of silicon nitride overlying said silicon oxide layer;

patterning said silicon oxide and silicon nitride layers to provide openings exposing portions of said silicon substrate that will be oxidized subsequently using the said local oxidation method;

depositing a metal layer overlying said silicon nitride layer and within said openings to said substrate;

selectively ion implanting channel-stops into said substrate through said openings;

reacting said metal layer with said silicon substrate where said metal layer contacts said substrate within said openings to form metal silicide regions wherein said reacting of said metal layer with said silicon substrate is accomplished by a first heating of said integrated circuit followed by stripping unreacted portions of said metal followed by a second heating of said integrated circuit;

removing said metal silicide regions leaving recesses in said silicon surface within said openings;

growing field oxide regions within said openings; and removing said silicon nitride and said silicon oxide layers thereby completing local oxidation of said integrated circuit.

13. The method of claim 12 wherein said metal layer has a thickness of between about 500 to 3000 Angstroms.

14. The method of claim 12 wherein said channel-stop implantation uses B+ ions with a dosage of between about 1 E 13 to 5 E 14 atoms/$cm^2$ and energy of between about 15 to 180 Kev.

15. The method of claim 12 wherein said channel-stop implantation uses $BF_2+$ ions with a dosage of between about 1 E 13 to 5 E 14 atoms/$cm^2$ and energy of between about 15 to 180 Kev.

16. The method of claim 12 wherein said first heating of said integrated circuit is to a temperature of between about 600° to 700° C. for about 10 to 30 seconds.

17. The method of claim 12 wherein said second heating of said integrated circuit is to a temperature of between about 750° to 900° C. for an additional 10 to 30 seconds.

18. The method of claim 12 wherein said metal layer is composed of titanium and said unreacted metal is stripped in aqueous alkali.

19. The method of claim 12 wherein said metal layer is composed of platinum and said unreacted metal is stripped in hot aqua regia.

20. The method of claim 12 wherein said metal layer is composed of cobalt and said unreacted metal is stripped in sulfuric acid.

21. The method of claim 12 wherein said metal layer is composed of palladium and said unreacted metal is stripped in sulfuric acid.

22. The method of claim 12 wherein said metal silicide regions are removed by a hydrofluoric acid solution.

23. The method of claim 12 wherein said metal silicide regions are removed by an $HNO_3$ solution.

24. The method of claim 12 wherein said growing of said field oxide regions also drives in said channel-stop regions.

25. The method of claim 12 wherein said silicon nitride and said silicon oxide layers are removed by phosphoric acid and hydrofluoric acid, respectively.

* * * * *